United States Patent [19]

Warner

[11] 4,170,190
[45] Oct. 9, 1979

[54] METHOD FOR DETECTING AND A DETECTOR FOR INDICATING EXCESSIVE TEMPERATURE AT ELECTRICAL WIRING DEVICES

[76] Inventor: John H. Warner, 44 Susan Dr., Newburgh, N.Y. 12550

[21] Appl. No.: 893,495

[22] Filed: Apr. 4, 1978

[51] Int. Cl.² ............................................. G01K 11/12
[52] U.S. Cl. ................................. 116/206; 339/113 R
[58] Field of Search .......... 73/356; 116/114 V, 114.5; 339/113

[56] References Cited

U.S. PATENT DOCUMENTS

| | | | |
|---|---|---|---|
| 1,693,369 | 11/1928 | Cochran | 116/114 V |
| 1,924,793 | 8/1933 | Laske | 116/114 V |
| 3,877,411 | 4/1975 | MacDonald | 116/114 V |

*Primary Examiner*—S. Clement Swisher
*Attorney, Agent, or Firm*—John Maier, III

[57] ABSTRACT

A method of detecting an excessive temperature at electrical wiring devices and detector for indicating by means of a color change an electrical failure at a wiring device which failure results in an excessive temperature increase.

14 Claims, 3 Drawing Figures

METHOD FOR DETECTING AND A DETECTOR FOR INDICATING EXCESSIVE TEMPERATURE AT ELECTRICAL WIRING DEVICES

BACKGROUND OF THE INVENTION

Aluminum electrical wire has been used extensively for branch circuits in structures including homes and mobile homes over the past couple of decades. A fire hazard is believed to occur from overheating caused by high resistance developing at the terminals where the aluminum wire is connected. This high resistance develops over a period of time apparently due to oxidation of the aluminum and relaxation of the forces holding the connection together. This combination of oxidation and relaxation results in high resistance. The electric current, of course, flows when the appliances or lights are turned on or other use of the electrical energy occurs. When electric current flows through the high resistance connection, heat results. since several outlets are usually connected in parallel in a chain-like arrangement within a circuit, current flowing to any particular point of consumption may be flowing through the terminal connections of several wiring devices.

As a result, temperatures of the high resistance connections become very high and terminals which glow red hot have occurred. It has been determined that temperatures may be reached with such wiring devices that are more than high enough to ignite the adjacent construction and household materials.

Perhaps the most favorable factor in minimizing such fires to date is that the development of high resistance at the connections usually progresses slowly. The resulting odor of heat and smoldering on occasion has been enough to detect such a failure. However, reliance upon this happening is hazardous, since this would indicate that the temperature is already dangerously high. Feeling of the wiring devices is obviously a help but again it is impractical to rely on such a method of detection, since at any given time, many of the outlets will not be conducting electrical current.

A detector which can be readily mounted on the wiring device and indicates to the homeowner when a hazard is developing, could prevent the serious consequences of allowing a hazard to go undetected. A detector which indicates an excessive increase in temperature by changing color irreversibly would achieve this desired result.

The use of color change for heat detection has been shown in the following patents:

| Inventor | Patent Number |
| --- | --- |
| Parker | 3,827,301 |
| Postal | 3,182,153 |
| Ferkel | 1,676,536 |
| Linebarger | 1,374,857 |

SUMMARY OF THE INVENTION

The present invention is a method of detecting an excessive temperature at electrical wiring devices and a detector which provides a positive temperature indication which can be visually observed at each wiring device. No changing in the wiring or the use of any expensive or special tools is required. The changes can be made by any householder possessing nothing more than a small screwdriver.

In each case where there is a wiring device, such as an electrical outlet or switch, one screw from the cover plate is removed and the detector which is the subject of this invention is placed therein. The detector includes a special screw with a film or coating on its exterior surface sufficient for the detection of high temperature within the wiring device.

There are other features of the present invention which will become obvious to those skilled in the art upon reading the disclosures set forth hereinafter.

DESCRIPTION OF THE DRAWINGS

Referring now to the drawings, which show an example of an arrangement within the scope of the present invention.

DETAILED DESCRIPTION

Figure 1:
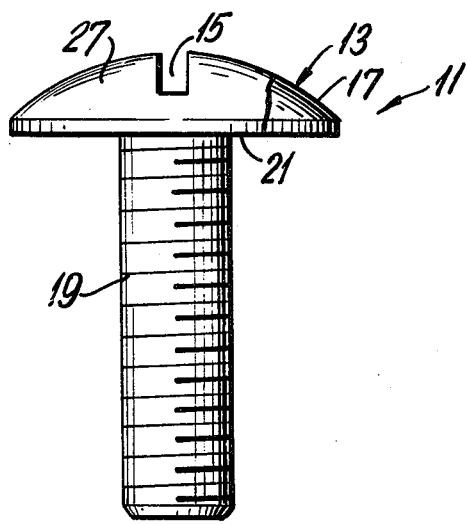
FIG. 1 is a plan view of the detector used in accordance with this invention.

In the example, in accordance with the present invention, as best shown in FIG. 1, a screw 1 made of an electrical heat conducting material, such as steel, brass or aluminum, is shown. This particular screw 11 preferably has an enlarged circular head 13 with a diameter of at least 0.30 inches but is preferably 0.364 inches in diameter or more. The head 13 includes a recess, most usually a slot 15 generally centrally located in the head 13 for use with a screwdriver (not shown) in the usual manner. The exterior surface 17 of the head, where the slot 15 is located is also best crowned or rounded to be most readily observed from all angles, but may be flat.

The threaded shank 19 of the screw 11 is rigidly secured to the interior surface 21 of the head 13 or is integrally formed with the head 13. The shank 19 has a six-thirty-second thread (6–32 thread) with a outer thread diameter of between 0.133 inch and 0.138 inches. The length of the shank 19 substantially $\frac{3}{8}$ of an inch or more. Such a thread is compatable with a standard electrical screw utilized for holding an cover plate 23 of an electrical wiring device 25 except that the flathead design normally used to recess into the beveled opening of the cover plate 23 is best replaced with a larger rounded head 13 having a diameter of at least 0.364 inches with the rounded head having a crowned radius of no greater than 0.31 inches.

A film or coating 27 is located on the exterior surface 17 of the head 13 of the screw 11. The film or coating 27 may be applied adhesively or by brush, spray or dipping. The film 27 s formed from a temperature-sensitive material which will change from one distinctive color to another at a temperature of no less than 150 degrees Farenheit and not greater than 200 degrees Farenheit. The color change will be irreversible. By way of example, a green color coated screw head will change to red indicating the presence of excessive temperature.

Various materials are commercially available which change color upon an increase in temperature. One source of these materials is the Tempil Division, Big Three Industries, Inc., Hamilton Boulevard, South Plainfield, N.J. 07080.

Figures 2, 3:
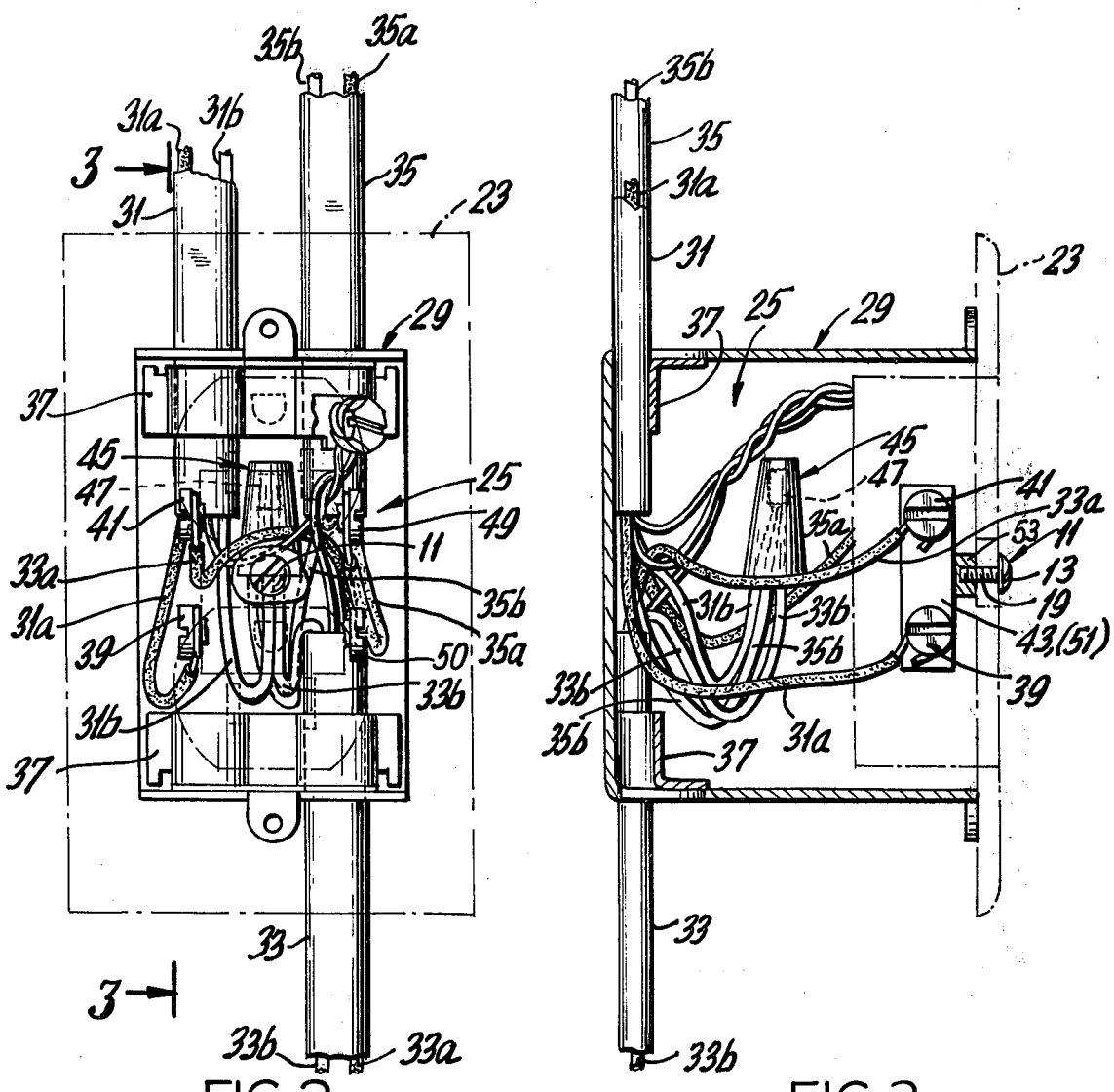
FIG. 2 is a plan view of an wiring device box in which the problem of high temperature rise could occur.
FIG. 3 is a cross-sectional view along line 3—3 of FIG. 2.

Referring now to FIG. 2, a standard electrical box 29 of the type frequently used in household wiring is shown. It should be pointed out that the size and type of the electrical junction box 29 does not change the functions of the detector and a round box or square box used in a commercial or dwelling wiring arrangement will operate in the same manner. FIG. 2 represents a standard electrical box situation often found within either a house or commercial wiring arrangement. A power line 31 from the source of power into the building enters the box and a power line 33 exits the box to go on to supply power to other electrical devices (not shown). The wiring device 25 shown as a duplex receptacle is located within the box 29. In a situation where the wiring device 25 will be switch operated, an electrical line 35 extends from the box 29 to another electrical box (not shown) where a wiring device, in this case a switch (not shown) is located. It can be seen from this that several or more wiring devices 25 within electrical boxes 29 in the building will be interconnected with the other.

In the electrical box 29, electrical cables 31, 33, 35 are held in place by a clamp 37. The electrical cables 31, 33, 35, each have two wires a and b. Wire 31 a of input cable 31 is connected to terminal screw 39 of the wiring device 25. Wire 33 a of output cable 33 is connected to terminal screw 41. The two terminal screws 39, 41 are electrically connected by a bus bar 43. Wire 31b of input cable 31 and wire 33b of output cable 33 along with wire 35b of switch cable 35 are interconnected in a pigtail 45 which is covered by a wire nut 47. Wire 35a of the switch cable 35 is connected to terminal screw 49. Terminal screw 49 is connected to an unused terminal screw 50 by a bus bar 51. It is at these points, namely the terminals screws 39, 41, 49 and also at the pigtail 45 where wires are connected, that the oxidation and relaxation frequently occur resulting in high resistance and excessive temperature. Failures may also occur at the wire nut 47.

The box 29 is covered with the cover plate 23 which may be made of either a heat conducting or nonheat conducting material. The screw 11 is threaded into an internally threaded insert 53 within the wiring device 25 or may be threaded into the wiring device 25 by some other suitable arrangement.

By the use of the screw 11 shown in FIG. 1 in the manner as best seen in FIG. 3, the screw 11 enters into the wiring device 25 where the screw 11 will absorb heat generated within the box 29. As heat develops, the heat will pass through the shank 19 of the screw 11 to the head 13 where at the specified temperatures, obvious, readily-identified and irreversible color change will occur in the film 27 on the head 13 of the screw 11.

It is to be recognized that the foregoing are but a few examples in accordance with the present invention and that various other arrangements will undoubtedly occur to those skilled in the art upon reading the disclosure set forth hereinabove. Accordingly, the scope of the present invention is limited only by the claims appended hereto.

I claim:

1. A detector for indicating excessive temperature at electrical wiring devices enclosed by a cover plate, comprising:
   a metallic cylindrical threaded shank adapted for threaded engagement with the electrical wiring device;
   a head means having an inner surface and an exterior surface, said inner surface being rigidly mounted on said metallic cylindrical threaded shank, said head means having a recess therein generally centrally located across its exterior surface for engaging the head means to turn the metallic cylindrical shank into the electrical wiring device, said inner surface being adapted to secure the cover plate over the electrical wiring device; and
   a film adhered to the exterior surface of said head means, said film being adapted to change color a predetermined temperature.

2. A detector according to claim 1 wherein said metallic cylindrical threaded shank has a 6–32 thread.

3. A detector according to claim 2 wherein said metallic cylindrical threaded shank has a length of at least ⅜ inches.

4. A detector according to claim 1 wherein said head means is circular, said metallic cylindrical threaded shank being substantially concentrically located in relationship to said head means.

5. A detector according to claim 4 wherein said head means has a crowned exterior surface.

6. A detector according to claim 1 wherein said predetermined temperature is within the range of 150 degrees Farenheit to 200 degrees Farenheit.

7. A detector according to claim 4 wherein said predetermined temperature is within the range of 150 degrees Farenheit to 200 degrees Farenheit.

8. A detector according to claim 1 wherein said circular head means has a rounded head with a crown radius of no more than 0.31 inches.

9. A detector for indicating excessive temperature at electrical wiring devices enclosed by a cover plate, comprising:
   a metallic cylindrical threaded shank, said shank being at least ⅜ of an inch long with a diameter between 0.133 inches and 0.138 inches and having a 6–32 thread and being adapted for theaded engagement with the electrical wiring device;
   a circular head means having an inner surface and an exterior surface, said inner surface being substantially concentrically and rigidly mounted on said metallic cylindrical threaded shank, said circular head means having a diameter of at least 0.30 inches, said head means having at least one recess generally centrally located across its exterior surface for engaging the head means to turn the metallic cylindrical shank into the electrical wiring device, said inner surface being adapted to secure the cover plate over the electrical wiring device; and
   a film adhered to the exterior surface of said head means, said film being adapted to change color irreversibly within the temperature range of 150 degrees Farenheit to 200 degrees Farenheit.

10. A detector according to claim 9 wherein said circular head means has a rounded head with a crown radius of no greater than 0.31 inches.

11. A method for detecting an excessive temperature at electrical wiring devices:
   forming a metallic cylindrical threaded shank with a head means having an inner surface and an exterior surface;
   painting a film on said exterior surface with a substance adapted to change color at a predetermined temperature;
   placing a cover plate over the electrical wiring device; and
   securing the cover plate to the electrical wiring device by threading the metallic cylindrical threaded shank into the electrical wiring device with the inner surface against the cover plate and the exterior surface exposed to view.

12. A method for detecting an excessive temperature at electrical wiring devices according to claim 11 wherein said predetermined temperature is within the range of 150 degrees Farenheit to 200 degrees Farenheit.

13. A method for detecting an excessive temperature at electrical wiring devices:

forming a metallic cylindrical threaded shank with a head means having an inner surface and an exterior surface;

painting a film on said exterior surface with a substance adapted to change color at a predetermined temperature;

threading the metallic cylindrical threaded shank into the electrical wiring device with the exterior surface exposed to view.

14. A method for detecting an excessive temperature at electrical wiring devices according to claim 13 wherein said predetermined temperature is within the range of 150 degrees Farenheit to 200 degrees Farenheit.

* * * * *